United States Patent [19]
Nightingale et al.

[11] Patent Number: 6,027,256
[45] Date of Patent: Feb. 22, 2000

[54] COMPOSITE LASER DIODE ENCLOSURE AND METHOD FOR MAKING THE SAME

[75] Inventors: John Lawrence Nightingale, Portola Valley; Matthew Rekow, Santa Cruz; Daniel K. Negus, Los Altos; Richard D. Cullins, Cupertino; Michael Jay Finander, Palo Alto, all of Calif.

[73] Assignee: Coherent, Inc., Santa Clara, Calif.

[21] Appl. No.: 09/007,173

[22] Filed: Jan. 14, 1998

Related U.S. Application Data

[60] Provisional application No. 60/038,686, Feb. 7, 1997.

[51] Int. Cl.$^7$ .................................................. G02B 6/42
[52] U.S. Cl. ............................................. 385/92; 385/88
[58] Field of Search ................................. 385/88, 92, 94, 385/138

[56] References Cited

U.S. PATENT DOCUMENTS

| | | | |
|---|---|---|---|
| 4,119,363 | 10/1978 | Camlibel et al. | 385/84 |
| 4,266,089 | 5/1981 | Scherer | 174/52 FP |
| 4,865,410 | 9/1989 | Estrada et al. | 385/92 |
| 4,997,243 | 3/1991 | Aiki et al. | 385/92 |
| 5,043,775 | 8/1991 | Lee | 357/19 |
| 5,127,072 | 6/1992 | Blauvelt et al. | 385/88 |
| 5,341,388 | 8/1994 | Masuda et al. | 372/36 |
| 5,504,762 | 4/1996 | Hutchison | 372/29 |
| 5,668,826 | 9/1997 | Bezinge et al. | 372/32 |
| 5,809,050 | 9/1998 | Baldwin et al. | 372/43 |

FOREIGN PATENT DOCUMENTS

| | | |
|---|---|---|
| 0 100 086 | 2/1984 | European Pat. Off. . |
| 0 732 781 A1 | 9/1996 | European Pat. Off. . |
| 60-180183 | 9/1985 | Japan . |
| 61-214594 | 9/1986 | Japan . |
| 1-010686 | 1/1989 | Japan . |
| 1-030034 | 1/1989 | Japan . |
| 2-308587 | 12/1990 | Japan . |
| 3-091283 | 4/1991 | Japan . |
| 8-036122 | 2/1996 | Japan . |

*Primary Examiner*—John D. Lee
*Assistant Examiner*—Juliana K. Kang
*Attorney, Agent, or Firm*—Limbach & Limbach L.L.P.

[57] ABSTRACT

A composite laser diode enclosure, and a method of making the same, having a first enclosure sealed within a second enclosure. Each enclosure having a thermally conductive base plate, a side wall band attached to the base plate, and a lid attached to the side wall band to hermetically seal each enclosure. The materials forming the side wall band and lids are selected so that high quality metallurgical bonds are formed between the base plates and the side wall bands, and between the side wall bands and the lids. The first enclosure contains a laser diode, coupling optics, and input ends of optical fibers for delivering the laser diode output out of the enclosures. The second enclosure contains the first enclosure, TE coolers, thermistors, and a PC board with an optical detector, E-prom, interlock circuit and voltage protection circuit. Thermistors monitor the temperature of each enclosure. The detector captures stray scattered radiation emanating from the first enclosure to monitor the output power of the laser diode. Sealed electrical and optical connections couple electrical and optical signals into and out of the enclosures while maintaining the hermetic seals of the enclosures.

23 Claims, 4 Drawing Sheets

COMPOSITE LASER DIODE ENCLOSURE AND METHOD FOR MAKING THE SAME

This application claims the benefit under 35U.S.C.§ 119(e) of U.S. provisional application 60/038,686, filed Feb. 7, 1997.

FIELD OF THE INVENTION

The present invention relates to laser diodes, and more particularly to sealed laser diode assembly enclosures.

BACKGROUND OF THE INVENTION

A multi-emitter laser diode produces a plurality of optical beams, one from each emitter. A common method of delivering the laser diode optical output to an intended application includes coupling the optical beams into a bundle of transport optical fibers. The input ends of the transport fibers are aligned to the laser diode emitters. Coupling optics are placed between the emitters and the transport fiber input ends to properly focus the laser diode output beams into the array of transport fibers. It is known to place the laser diode, coupling optics and transport fiber input ends inside a sealed enclosure to prevent contamination of the laser diode emitters, coupling optics and transport fiber input ends. Since the laser diode generates heat that must be efficiently conducted out of the enclosure during operation, copper is the material of choice for such laser diode enclosures. The copper material provides an efficient thermal conduction path out of the laser diode enclosure.

Sealed laser diode enclosures are typically fabricated from a single, heavily-machined, copper block. The block is hollowed out to form a base portion and wall portions extending upwards and terminating at a top opening. The laser diode, coupling optics and transport fibers are mounted inside the hollowed enclosure. Heat generated by the diode is conducted out of the enclosure through the base portion. Sealed ports are formed in the side walls of the enclosure to allow electrical and optical signals to penetrate the enclosure. A lid is glued over the top opening to hermetically seal the enclosure.

There are several disadvantages in forming the laser diode enclosure from a single block of material, especially copper. First, it is complicated and expensive to machine the enclosure out a single block of material. This process also wastes the material removed from the block to form the enclosure. In addition, the high thermal conductivity of the copper walls (about 388 W/m·K) makes it difficult or impossible to use desirable high temperature metallurgical bond forming techniques, such as soldering or welding, to attach the lid onto the side walls. Instead, it is common to glue the lid onto the copper walls of the enclosure. Glue, however, is difficult and messy to apply, a glue bond is not as repeatable or reliable as metallurgical bonds, glue takes time to cure, and glue can outgas during and/or after curing which can contaminate the interior of the enclosure.

It is conceivable to use a less thermally conductive enclosure material to facilitate soldering or welding of the lid to the enclosure walls. However, the base portion would not adequately conduct the thermal output of the laser diode out of the enclosure as required during laser diode operation.

One solution has been to fabricate the laser diode enclosure with a copper base plate and four Kovar metal side walls attached together and attached to the copper base. A Kovar metal lid is attached to the top of the Kovar side walls. While Kovar metal has a relatively low thermal conductivity (about 17 W/m·K), this configuration has several drawbacks.

First, Kovar has a much lower coefficient of thermal expansion (about 5 ppm/° C.) than copper (about 18 ppm/° C.). Therefore, it is difficult to provide a quality direct metallurgical bond between the Kovar side walls and the copper base plate, either by soldering, brazing or welding. A good metallurgical bond between the base plate and walls is preferred because it results in a good strong seal while providing good thermal and electrical conductivity. The difference in expansion of the Kovar walls relative to the copper base plate during a soldering, welding, and/or brazing operation is too great to allow these processes to yield a reliable high quality metallurgical bond. Therefore, copper skirts and other expensive and complicated attachment assemblies and techniques have instead been used to connect Kovar side walls to copper base plates.

There is a need for simple, inexpensive laser diode enclosure that facilitates easy and reliable attachment of the side walls to the base plate and the lid with high quality metallurgical bonds. Such an enclosure should hermetically seal the laser diode and delivery system optics for contamination protection, while providing an efficient and reliable heat path to conduct the thermal load of the laser diode out of the enclosure.

SUMMARY OF THE INVENTION

The present invention solves the aforementioned problems by providing a composite sealed enclosure around the laser diode, coupling optics, and input ends of the transport fibers. The laser assembly of the present invention includes a first enclosure having a base plate, a side wall band and a lid. The base plate is formed of a material that is thermally and electrically conductive and has a first coefficient of thermal expansion and a thermal conductivity that is greater than about 100 W/m·K. The a side wall band is formed of a material that is electrically conductive, has a thermal conductivity of less than about 100 W/m·K, and has a second coefficient of thermal expansion that is within ±30% of the first coefficient of thermal expansion. The sidewall band has a lower edge attached to the base plate by a metallurgical bond, and a optical port formed therein. The lid is attached to an upper edge of the sidewall band. The base plate, the side wall band and the lid define a sealed volume therein. A laser diode is disposed inside the sealed volume and produces an optical output that exits the sealed volume through the optical port. The laser diode has an anode and a cathode.

In another aspect of the present invention, a laser diode assembly includes an enclosure having a base plate, a side wall band and a lid. The side wall band is formed of an electrically conductive material, and has a optical port formed therein and a lower edge attached to the base plate. The lid is attached to an upper edge of the sidewall band. The base plate and the side wall band and the lid define a sealed volume therein. A hollow nose piece is disposed in the optical port. An electrically insulating seal is disposed in the optical port to electrically insulate the hollow nose piece from the side wall band. A laser diode inside the sealed volume produces an optical output that exits the sealed volume through the nose piece.

Other objects and features of the present invention will become apparent by a review of the specification and appended figures and claims.

DETAILED DESCRIPTION OF THE PREFERRED EMBODIMENTS

Figure 1:
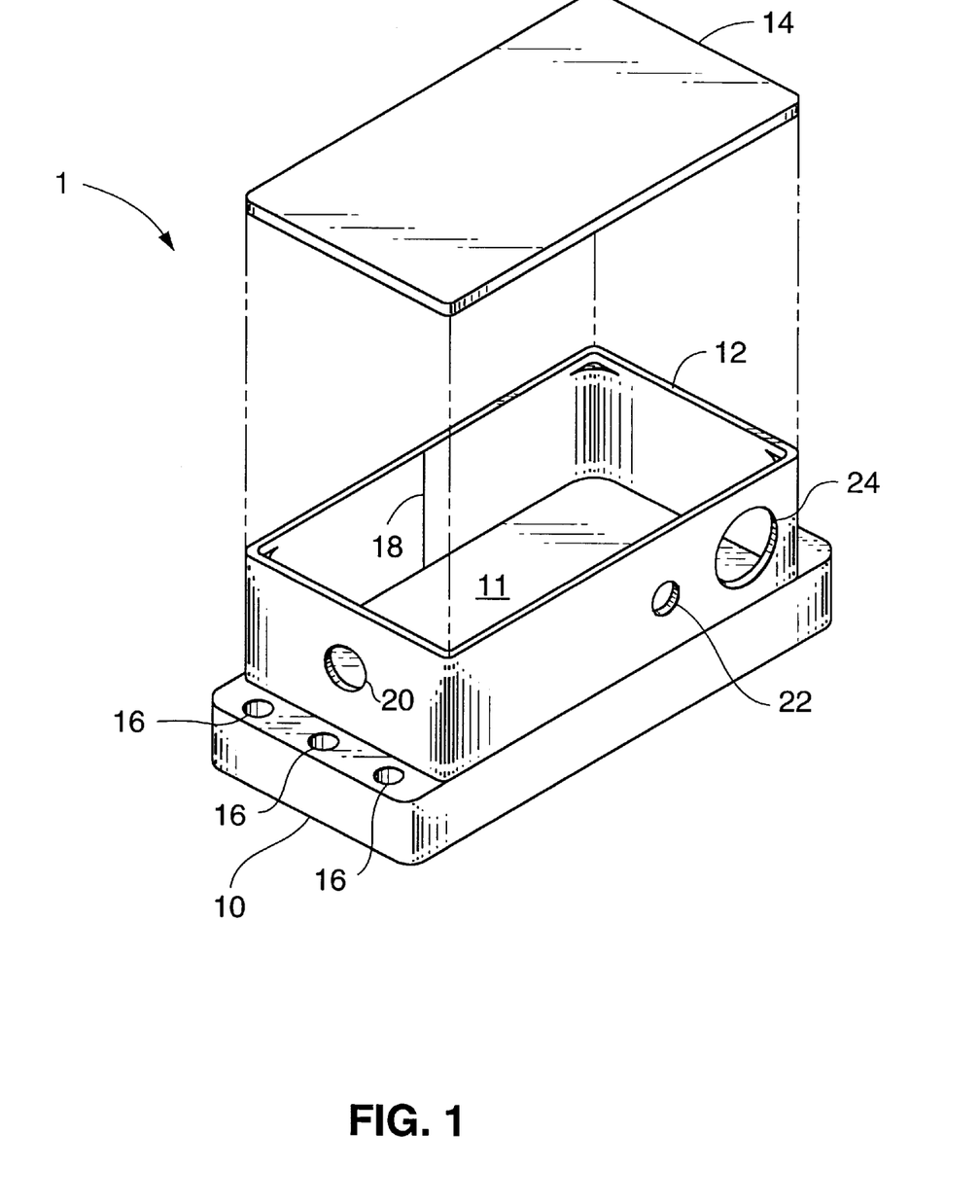
FIG. 1 is an exploded perspective view of the first laser diode enclosure of the present invention.
Figure 2:
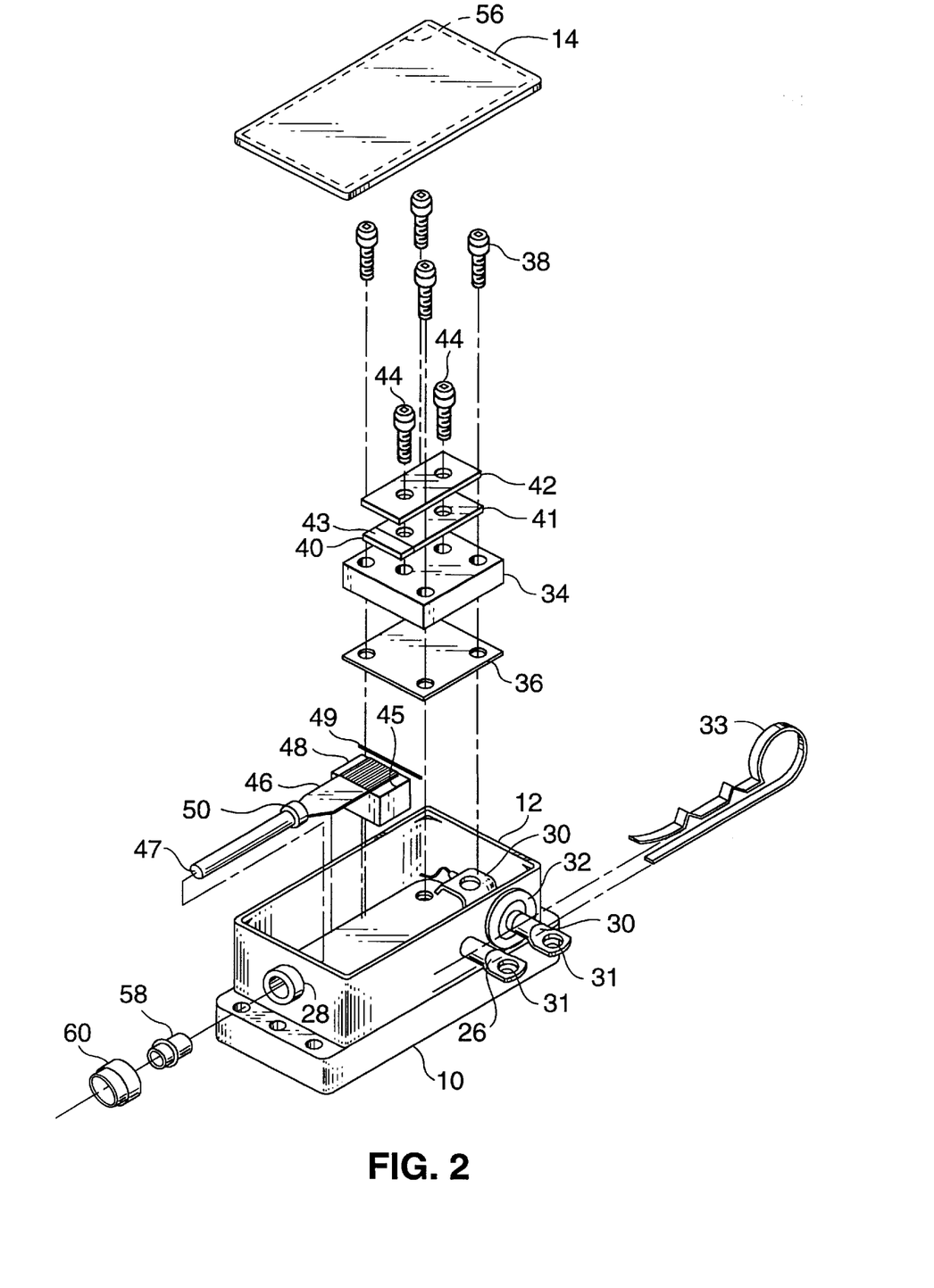
FIG. 2 is an exploded perspective view of the laser diode and first enclosure of the present invention.

The first composite laser diode enclosure 1 of the present invention is illustrated in FIGS. 1 and 2, and includes base plate 10, side wall band 12 and lid 14, which are attached together by high quality metallurgical bonds. The enclosure 1 provides excellent heat path cooling for a laser diode mounted therein, high thermal and electrical conduction between the base plate 10 and side wall band 12, and environmental contamination protection for optical and electrical elements mounted inside the sealed enclosure 1.

The base plate 10 is a flat plate of highly thermal and electrical conductive material, ideally copper. The base plate 10 is machined nominally flat, but could include an elevated central area 11 to self register the side wall band 12 thereto. Mounting holes 16 are formed near each end for mounting the base plate 10 to, for example, a thermoelectric cooler, heatsink, etc. In order to sufficiently conduct heat from high power laser diodes, the base plate 10 need to be made of a material having a thermal conductivity that exceeds 100 W/m·K. Examples of such materials include molybdenum, copper, copper tungsten, and other copper alloys.

The side wall band 12 is formed of a material having a low enough thermal conductivity (TC) to enable soldering or welding of the lid 14 to the side wall band 12, while having a coefficient of thermal expansion (CTE) sufficiently close to that of the copper used to form the base plate 10, so that good metallurgical bonds between the side band 12 and base plate 10, and between the side band 12 and lid 14, can be formed. This material needs to have a TC of less than about 100 W/m·K so that soldering or welding the lid 14 to the side wall band 12 results in a high quality metallurgical bond. Further, this material needs to have a CTE within about +/−30% of the CTE of the material used to make the base plate 10 so that soldering, brazing, or welding the side wall band 12 to the base plate 10 results in a high quality metallurgical bond. Therefore, if the base plate 10 is made of copper having a CTE of about 18 ppm/° C., then adequate side wall band materials are any metals with a TC that is less than about 100 W/m·K, and with a CTE within about 12.5 to 23.5 ppm/° C. Examples of such metals are stainless steel (TC of about 16 W/m·K, CTE of about 17 ppm/° C.), nickel (TC of about 56 W/m·K, CTE of about 14 ppm/° C.), and monel (TC of about 26 W/m·K, CTE of about 15 ppm/° C.).

The side wall band 12 can be fabricated by bending a strip of sheet stock of material to match the dimensions of the base plate 10. A seam 18 is formed where the ends of the strip of sheet stock meet, as illustrated in FIG. 1. Alternately, the side wall band 12 can be fabricated from a deep drawn continuous part, such that the side wall band 12 is seamless. If a seam 18 is present, it is best sealed by soldering, brazing or welding (seam or laser) the ends of the sheet stock strip together.

The side wall band 12 is then soldered, brazed or welded to the base plate 10 to form a high quality metallurgical bond therebetween.

Fiber port 20, anode port 22 and cathode port 24 are formed into the side wall band 12 either before or after band 12 is bonded onto the base plate 10. An anode lead 26 is attached into anode port 22 to seal port 22 and to electrically connect anode lead 26 to side wall band 12. A bushing 28 is connected into the fiber port 20. Preferably, the bushing 28 is made of an electrically insulating material, such as glass or ceramic. A cathode lead 30, and an insulation seal 32 surrounding the cathode lead 30, are attached into the cathode port 24 to seal port 24. Insulation seal 32 is made of an electrically insulating material, such as glass or ceramic, to electrically insulate the cathode lead 30 from side wall band 12.

The anode lead 26 and the cathode lead 30 each terminate in an eyelet 31 to facilitate connection to a power source. Anode and cathode leads 26/30 are engageable with a removable grounding clip 33 that shorts the anode and cathode leads 26/30 together so that stray voltages that otherwise may be applied to, and damage, the laser diode 40 during the fabrication, transportation and/or installation of the enclosure 1 are avoided.

Inside enclosure 1, heat sink 34 and seal 36 are mounted to the base plate 10 via screws 38. The heat sink 34 is made of a high electrically and thermally conductive material, preferably copper. The seal 36 is preferably made of indium to facilitate thermal and electrical conduction between the heat sink 34 and base plate 10. A laser diode bar 40 and insulator block 41 are mounted between the heat sink 34 and a cathode plate 42, which is attached by screws 44. The laser diode 40 is preferably soldered to the heat sink 34 for good thermal and electrical conduction. The cathode lead 32 extends to, and engages with, the cathode plate 42 and one of the screws 44. A copper foil lead 43 electrically couples the top cathode surface of the laser diode 40 to the cathode plate 42.

Figure 3:
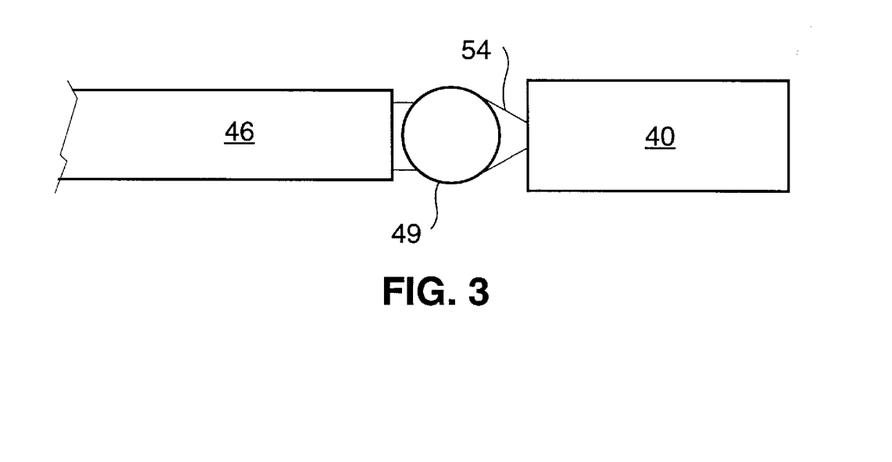
FIG. 3 is a side view of the cylindrical lens used to focus the laser diode output in the optical fibers.

A fiber array support block 48 is mounted on the base plate 10. Input ends 45 of an array of fibers 46 are mounted, preferably with solder or glue, onto the support block 48. The support block 48 positions the input ends 45 of the fibers 46 adjacent to the emitters of the laser diode bar 40. A cylindrical lens 49 is positioned lengthwise across the input ends 45 of the optical fibers 46, as illustrated in FIGS. 2 and 3. The cylindrical lens 49 is positioned adjacent the laser diode bar 40 to collimate/focus the diverging optical output 54 of each laser diode emitter of the laser diode bar 40 into the corresponding fiber 46.

A hollow nose piece 50 is attached into bushing 28 to form a seal therewith. The array of fibers 46 pass through nose piece 50 in a tightly packed circular bundle configuration to couple the laser diode output 54 out of the enclosure 1 and to maintain the hermetic seal of enclosure 1. Mounting the nose piece 50 within insulating bushing 28 electrically isolates the nose piece 50 from the rest of the enclosure 1. This allows electrically conductive fiber assemblies to attach to nose piece 50 without shorting to the enclosure 1 and possibly damaging the laser diode 40. An SMA ferrule connector 58 and nut 60 can be attached to the nose piece 50 for optically coupling an external optical fiber to the output end 47 of the array of fibers 46. However, the array of optical fibers 46 could alternately pass completely through the nose piece 50, wherein the connector 58 and nut 60 would not be necessary.

The lid 14 is attached to the upper edges of the side wall band 12 to hermetically seal the enclosure 1, preferably by seam-welding, laser-welding or by soldering. To center the lid 14 onto the side wall band 12, a notch 56 can be formed on the underneath surface of the lid to engage the side wall band 12. The notch 56 can be formed using a photolithographically defined etching process. The lid 14 can be made of the same material as the side wall band 12 because bonding similar metals together results in a superior metallurgical bond. However, to facilitate the seam-welding, laser-welding, or soldering of the lid 14, the lid material should have a thermal conductivity of less than about 100 W/m·K. Such lid materials can be stainless steel, nickel, monel or kovar.

When a voltage is placed across the anode lead 26 and the cathode lead 30, electrical current passes through the cathode lead 30, cathode plate 42, copper foil 43, laser diode 40, heatsink 34, indium seal 36, base plate 10, side wall band 12, and out anode lead 26. The electrical current passing through the laser diode 40 produces an optical output 54 that is captured by the cylindrical lens 49 and focused into the optical fibers 46. The optical output is guided by the optical fibers 46 out of the enclosure 1 through nose piece 50.

For efficient cooling of the laser diode 40, the heatsink 34 has a sufficient thickness to spread the heat generated by the laser diode 40 across the bottom surface of the heatsink 34 for efficient thermal coupling to the base plate 10. Likewise, the base plate 10 has a sufficient thickness to spread the heat coupled thereto from the heatsink 34 across the bottom surface of the base plate 10 for efficient thermal coupling to, for example, a thermo-electric cooler or heat sink. Alternately, a heat spreader 52, in the form of a copper plate, can be disposed under base plate 10. Such a heat sink is ideal when the base plate 10 is dimensionally smaller than the thermo-electric cooler or heat sink to which the base plate 10 is mounted. The thermo-electric cooler or heat sink controls the temperature of the enclosure 1, and therefore the temperature of the laser diode 40 during operation. Accurate regulation of the laser diode temperature is important during operation because laser diode lifetime is increased with lower operating temperatures, and the laser diode output wavelength is dependent upon the laser diode temperature.

The preferred materials and method of attaching the various elements of the enclosure 1 of the present invention is as follows. A stainless steel band 12 and lid 14 are plated with sulfimate nickel. The copper plate 10 (with heat spreader 52), stainless steel band 12, bushing 28, anode lead 26 and support block 48 are brazed in place as described above in a single brazing operation using a 71.15% Ag, 28.1% Cu, 0.75% Ni braze material. The brazing operation is performed in a hydrogen atmosphere, to keep materials oxide free, at a furnace temperature of approximately 800–850° C. Then, the cathode lead 30 is brazed into the cathode port 24 using a lower melting temperature braze material (i.e. 88% Au, 12% Ge) at a lower furnace temperature (about 400° C.). The lower brazing temperature is necessary to avoid damaging the seal 32. The entire enclosure 1 is then nickel and gold plated for cosmetic effect and to enhance the soldering or welding of additional parts to the enclosure 1 as needed. Nickel plating of the stainless steel band 12 and lid 14 can be avoided by using a 35% Au, 65% Cu braze material at a furnace temperature of about 1050° C.

The remaining elements are mounted inside the enclosure 1 as described above. A stainless steel lid 14 is seam-welded or laser-welded to the top of the side wall band 12 to hermetically seal the enclosure 1. Seam-welding or laser welding the lid is preferred over gluing or other forms of attachment because welding is clean (no contamination of enclosure interior), fast, requires no additional materials, and is quite repeatable.

Another aspect of the present invention, a second enclosure 101 that surrounds and protects enclosure 1 will now be described.

Figure 4:
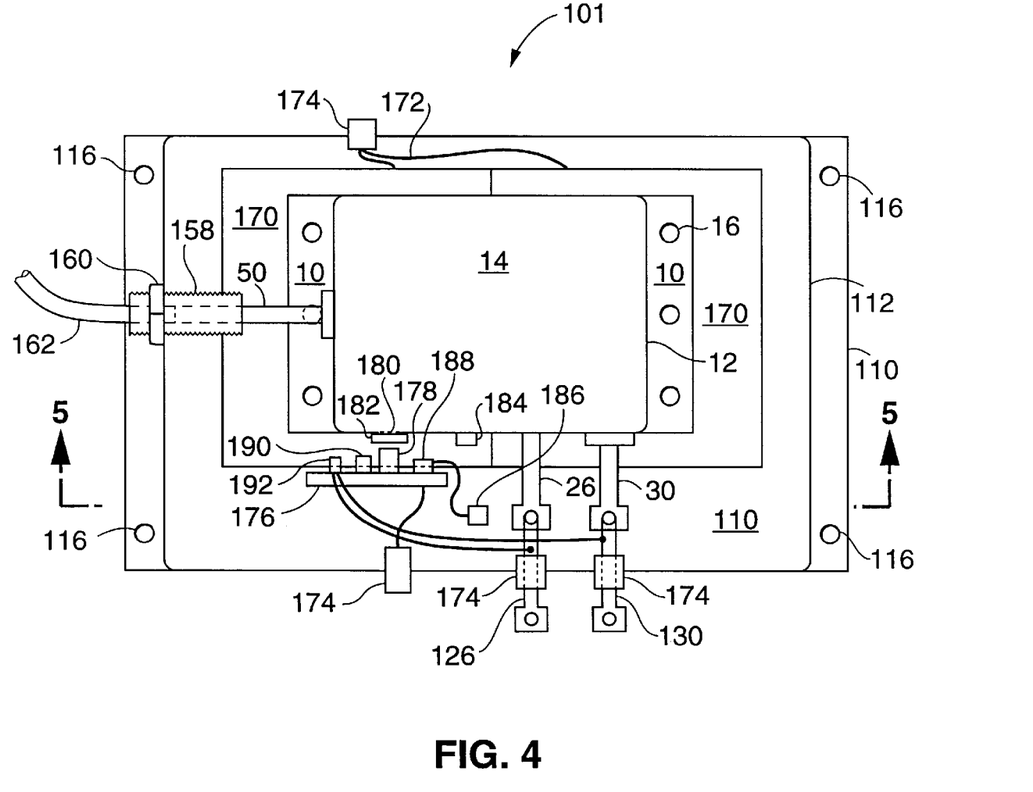
FIG. 4 is a top view of the second enclosure with the lid removed to expose the first enclosure mounted therein.
Figure 5:
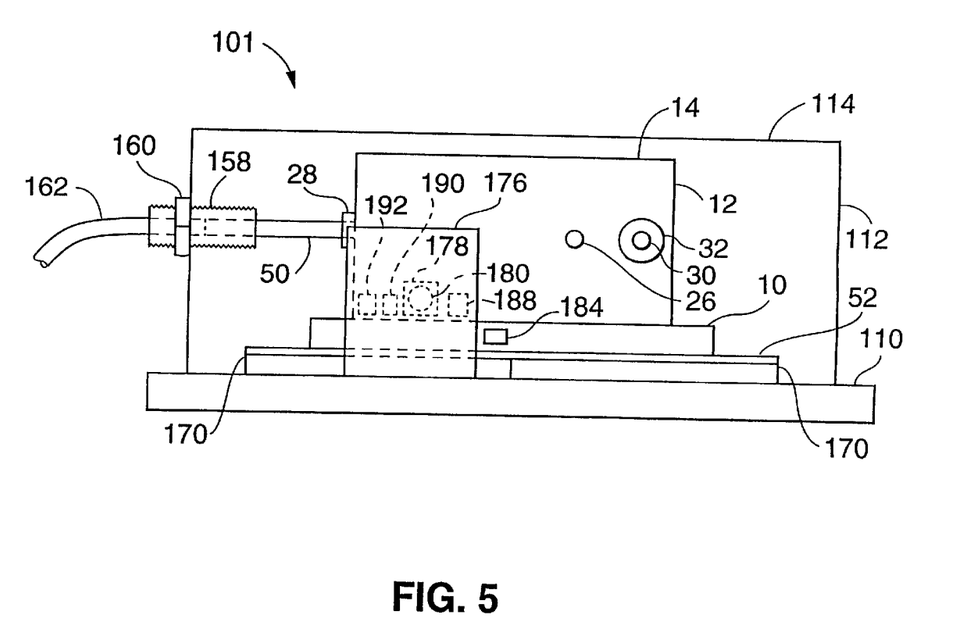
FIG. 5 is a side cross-sectional view of the first and second enclosures of the present invention.

During laser diode operation, the base plate 10 of enclosure 1 must be cooled. Further, to avoid ground loops, it is desirable to electrically isolate enclosure 1, since it is used to couple the anode lead to the anode side of the laser diode 40. For maximum protection of the laser diode 40, and for ease of use by the user, the enclosure 1 can be sealed within a second enclosure 101, as illustrated in FIGS. 4–5. Most of the electronic devices used to operate and monitor the operation of the laser diode 40 are located inside the second enclosure 101, which also is electrically isolated from enclosure 1.

The second enclosure 101 is of the same construction as enclosure 1. Second enclosure 101 includes a base plate 110, preferably made of copper, a side wall band 112, preferably made of stainless steel, and a lid 114, preferably made of stainless steel. High quality metallurgical bonds are formed between the base plate 110 and side wall band 112, and between the side wall band 112 and the lid 114 as described above for enclosure 1. There are a plurality of sealed ports in side wall band 112 that allow electrical and optical signals to pass in or out of enclosure 101.

Thermo-electric coolers (TEC's) 170 are mounted to the base plate 110. Enclosure 1 is mounted to the TEC's 170. The TEC's 170 have two functions. First, the TEC's 170 electrically insulate the base plate 10 of enclosure 1 from the base plate 110 of second enclosure 101. Second, as well known in the art, the TEC's provide variably cooling of base plate 10 of enclosure 1, thereby coupling heat generated by the laser diode 40 out to the base plate 110 of second enclosure 101. The preferred embodiment uses two TEC's 170 positioned side-by-side, each with electrical input leads 172 that extend out of enclosure 101 through an insulated sealed electrical feed-thru 174. The TEC's 170 cool the base plate 10 to a precise temperature, which results in a precise operating temperature for the laser diode 40.

Feed-thru's 174 can be any electrical connector that couples electrical signals through the side wall band 112 while maintaining the hermetic seal of the enclosure 101. Examples of such connectors are #CE2021-15/CT143-8-3/FP from TE Industries, Orange, N.J.; and multi-pin feed-thru's FR-12S-4PC and HER-7S4PC from Microtech, Boothwin, Pa.

The nose piece 50 passes through side wall band 112 via sealed connector 158. Nut 160 make a seal with side wall band 112, and connector 158 makes a seal with nose piece 50, to preserve the hermetic seal of enclosure 101. Nose piece 50 preferably terminates inside connector 158, where an external delivery fiber 162 butt couples with the fibers 46 to deliver the laser diode optical output to the desired application. Since nose piece 50 is electrically insulated from enclosure 1, nose piece 50 does not electrically couple the enclosures 1/101 together.

Second anode and cathode leads 126 and 130 connect to anode and cathode leads 26 and 30, and extend out of enclosure 101 via feed-thru's 174 or any other equivalent means for electrically insulating the anode and cathode leads 126/130 from side wall band 112 while maintaining the hermetic seal of enclosure 101.

A printed circuit board (PCB) 176 is mounted vertically on base plate 110, adjacent side wall band 12. PCB 176 contains electronic components used to monitor the operation of the electrical and optical components inside enclosure 101. Signals going from the PC board 176 are coupled out of enclosure 101 through the side wall band 112 via an insulated feed-thru 174.

PCB 176 contains an optical detector 178 that can measure the power, wavelength, and/or pulse width, etc. of laser diode 40. The detector 178 is directed toward a detector hole 180 formed in the side wall band 12 of enclosure 1. Detector hole 180 is sealed with a translucent diffuser 182, such as translucent alumina, for coupling randomly scattered light out of the enclosure 1.

During diode laser operation, most of the light generated by the laser diode 40 is focused by the cylindrical lens 49 into the optical fibers 46. However, some light is randomly scattered out into the interior of enclosure 1, where the scattered light undergoes multiple reflections off of the inner surfaces of lid 14, side wall band 12, and base plate 10, as well as any other elements contained within the sealed enclosure 1. Sources of the randomly scattered light include surface reflections from the light entering the cylindrical lens 49, internal reflections inside the cylindrical lens 49 that exit out its curved surface and both its end surfaces, reflections off of the front surface of the input ends 45 of the optical fibers 46, wide angle emissions from the emitters of the laser diode bar 40 that are not captured by the cylindrical lens 49, and/or leakage light passing out through the rear of the laser diode 12. The detector hole 180 is positioned such that any of the randomly scattered light generated from the above listed sources cannot reach the hole 180 without reflecting at least once off of the side walls band 12, lid 14, base plate 10, and/or any other component within sealed enclosure 1. The enclosure 1 integrates the various sources of scattered light through the multiple reflections therein. The integrated scattered light has been found to very accurately represent the light actually produced by the laser diode 40 and coupled into the optical fibers 46. The interior surfaces of the enclosure can be coated or plated with reflective coatings, such as gold, nickel, titanium oxide, etc., to enhance the multiple reflections within enclosure 1.

A thermistor 184 is mounted on the base plate 10 to monitor the temperature of the enclosure 1. A second thermistor 186 is mounted on the base plate 110 to monitor the temperature of the second enclosure 101. The outputs of each of these thermistors, in conjunction with information regarding the thermoelectric cooler current, can be used to monitor the efficiency of the thermoelectric coolers 170, and to change their operating current and/or trigger additional cooling devices that cool base plate 110. Such addition cooling devices can include cooling fans, water cooled heat sinks, etc. If the thermistors indicate additional cooling is required, the fan speed or water flow can be increased to help maintain the desired temperature of the laser diode 40 during operation. It is preferable that the outputs of thermistors 184/186 are directed to the PCB 176, to minimize the number of electrical feed-thru's 174 in side wall band 112.

PCB 176 contains an E-prom 188 (such as #X24CO4S8 from Xicor, Milpitas, Calif.) which records various laser diode operating parameters, such as the measured temperatures from thermistors 184/186, as well as the laser diode wavelength, power and/or pulse width measured by detector 178. Further, the E-prom 188 can record operating parameters such as laser diode threshold current, operating current, unit serial number, total operating hours etc. Alternately, but with less flexibility, these values could be recorded using potentiometers or some other circuitry other than an E-prom.

PCB 176 also includes other circuits, such as an over-temperature interlock circuit 190 and electrical transient protection circuit 192. The interlock circuit 190 generates a signal indicating the operating power of the laser diode 40 should be turned down or off to prevent thermal damage. The protection circuit 192 is attached to leads 26/126 and 30/130, and protects the laser diode 40 from voltage spikes and reverse voltages appearing across these leads.

There are several advantages to placing the laser diode 40 inside sealed enclosure 1, and cooling the sealed enclosure 1 through base plate 10 with the TEC's 170. Condensation on the laser diode 40, which can damage the diode 40 and other elements nearby, is a problem associated with locating the laser diode in the same enclosure that contains the thermoelectric coolers. Further, thermal compounds and other materials used to increase the thermal coupling of the TEC's tend to outgas or otherwise contaminate the interior of the sealed enclosure. Moreover, once the enclosure is sealed, the TEC's are not accessible for replacement or repair. Lastly, additional sealed and insulated electrical leads must be provided in the side wall band 12 for coupling the electric signals needed to operate the TEC's. However, with the present invention, the TEC's are located outside of the enclosure 1, so that condensation and thermal compounds associated with the TEC's 170 do not damage or contaminate the laser diode 40 or the enclosure 1.

Sealing the enclosure 1 inside the second enclosure 101 provides a single, self-contained laser diode package (enclosure 101) that is electrically insulated from the laser diode while containing most of the necessary electrical and optical elements to monitor the laser diode performance. High quality metallurgical bonds ensure enclosures 1 and 101 are hermetically sealed with good electrical and thermal conduction between the bonded parts. Sealed enclosure 1 protects the laser diode 40, cylindrical lens 49 and optical fibers 46 from the other elements in enclosure 101 that are necessary to operate the laser diode, such as the PCB 176 and its associated electronic circuits, thermistors 184/186, detector 188, TEC's 170, thermal coupling compounds, etc. These possible sources of contamination and/or condensation cannot adversely affect the interior of enclosure 1, but are accessible for replacement and/or repair without breaking the hermetic seal of enclosure 1. Electrical connectors 174, optical connector 158, and leads 126/130 allow the user to conveniently connect and disconnect electronic and optical systems required to operate the laser diode system.

It is to be understood that the present invention is not limited to the embodiments described above and illustrated herein. For example, the laser diode could be a single emitter diode coupled to a single optical fiber. Further, the present invention is not limited to the use of a cylindrical focusing lens or transport fiber delivery systems, but instead encompasses any other coupling optic/delivery system arrangement that efficiently directs the laser diode output out of the sealed diode enclosure. Moreover, enclosures 1 and/or 101 could be used in any application where a localized heat source needs to be sealed for the surrounding environment, while providing an efficient conduction cooling path for a heat source that requires cooling. In addition, enclosures 1 and/or 101 of the present invention can be used in conjunction with non-fiber delivered laser diode assemblies. For example, optical windows can be used to couple the laser diode output out of enclosures 1 and 101 through side wall bands 12 and 112. Further, the electrical circuits and devices mounted on PCB 176 could be separately mounted anywhere within the enclosure 101, so long as the detector 178 is properly aligned to the detector hole 180. Lastly, as stated above, enclosure 1 can be used separately, or in conjunction with enclosure 101.

What is claimed is:

1. A laser diode assembly, comprising:
a first enclosure including:
a base plate formed of a material that is thermally and electrically conductive and has a first coefficient of thermal expansion and a thermal conductivity that is greater than about 100 W/m·K, a side wall band formed of a material that is electrically conductive and has a thermal conductivity of less than about 100 W/m·K and has a second coefficient of thermal expansion that is within ±30% of the first coefficient of thermal expansion, the sidewall band having a lower edge attached to the base plate by a metallurgical bond, the sidewall band having a optical port formed therein, and a lid attached to an upper edge of the sidewall band, wherein the base plate and the side wall band and the lid define a sealed volume therein; and a laser diode disposed inside the sealed volume for producing an optical output that exits the sealed volume through the optical port.

2. The laser diode assembly of claim 1, wherein the lid is attached to the sidewall band upper edge by a metallurgical bond.

3. The laser diode assembly of claim 1, further comprising:

a cathode port formed in the sidewall band, an electrically insulating seal in the cathode port, the laser diode has an anode and a cathode, a heat sink formed of a thermally and electrically conductive material is attached to the base plate, the laser diode is attached to the heat sink such that the anode is electrically and thermally connected to the heat sink and the heat sink is electrically and thermally connected to the base plate, a cathode lead having one end attached to the cathode of the laser diode and another end extending out of the first enclosure through the annular seal in the cathode port such that the cathode lead is electrically insulated from the sidewall band, and an anode lead electrically connected to the sidewall band, wherein the laser diode produces the optical output when a voltage is placed across the cathode and anode leads.

4. The laser diode assembly of claim 1, wherein the optical port is sealed with an optical window.

5. The laser diode assembly of claim 1, further comprising:

at least one optical fiber with an input end positioned adjacent to the laser diode to couple the optical output into the optical fiber, the optical fiber having an output end that extends through the optical port.

6. The laser diode assembly of claim 5, further comprising:

a hollow nose piece disposed in the optical port, wherein the output end of the optical fiber extends through the nose piece.

7. The laser diode assembly of claim 6, further comprising:

an electrically insulating seal disposed in the optical port to electrically insulate the hollow nose piece from the side wall band.

8. The laser diode assembly of claim 1, wherein the material forming the first enclosure base plate is copper, and the material forming the first enclosure side band is one of stainless steel, nickel and monel.

9. The laser diode assembly of claim 1, wherein:

a detector port is formed in the sidewall band to couple therethrough randomly scattered optical output from the laser diode out of the first enclosure.

10. The laser diode assembly of claim 1, further comprising:

a second enclosure including:

a second base plate formed of a material that is thermally conductive and has a third coefficient of thermal expansion and a thermal conductivity that is greater than about 100 W/m·K, a second side wall band formed of a material that is electrically conductive and has a thermal conductivity of less than about 100 W/m·K and has a fourth coefficient of thermal expansion that is within ±30% of the third coefficient of thermal expansion, the sidewall band having a lower edge attached to the second base plate by a metallurgical bond, the second sidewall band having a second optical port formed therein through which the optical output is directed, and a second lid attached to an upper edge of the second sidewall band, wherein the second base plate and the second side wall band and the second lid define a second sealed volume that contains the first enclosure therein.

11. The laser diode assembly of claim 10, further comprising:

a thermoelectric cooler having a bottom surface attached to the second base plate and a top surface having a thermal connection to the base plate of the first enclosure.

12. The laser diode assembly of claim 10, further comprising:

a first and a second ports formed in the second sidewall band, wherein the anode and cathode leads have ends that extend out of the second enclosure through the first and second ports respectively.

13. The laser diode assembly of claim 12, further comprising:

first and second feed thru's disposed in the first and second ports respectively to electrically insulate the anode and cathode leads from the second side wall band.

14. The laser diode assembly of claim 13, wherein:

a detector port is formed in the sidewall band of the first enclosure to couple therethrough randomly scattered optical output from the laser diode out of the first enclosure;

a printed circuit board is disposed inside the second enclosure but outside the first enclosure and having an optical detector that is disposed adjacent the detector port to detect the randomly scattered optical output exiting through the detector port.

15. The laser diode assembly of claim 14, further comprising:

one of a translucent diffuser and a transparent window disposed in the detector port to couple the randomly scattered optical output through the detector port.

16. The laser diode assembly of claim 14, further comprising:

a first and a second thermistor attached to the base plate of the first enclosure and the second base plate respectively, a temperature regulation circuit that operates the thermoelectric cooler based upon signals from the first and second thermistors.

17. The laser diode assembly of claim 14, wherein the printed circuit board further includes an over-temperature interlock to reduce or terminate operating power to the laser diode when temperature sensed by the first thermistor exceeds a predetermined value.

18. The laser diode assembly of claim 14, wherein the printed circuit board further includes an E-prom for recording laser diode operating parameters.

19. The laser diode assembly of claim 14, wherein the printed circuit board further includes an electrical transient protection circuit that is connected to the anode and cathode leads which absorbs voltage spikes and reverse voltages appearing across the anode and cathode leads.

20. The laser diode assembly of claim 10, further comprising:
   at least one optical fiber with an input end positioned adjacent to the laser diode to couple the optical output into the optical fiber, the optical fiber having an output end that extends through the optical port; and
   an optical connector disposed in the second optical port for butt coupling the output end of the optical fiber to an input end of a delivery optical fiber.

21. The laser diode assembly of claim 10, wherein the material forming the second base plate is copper, and the material forming the second side band is one of stainless steel, nickel and monel.

22. A method of forming a laser diode enclosure, comprising the steps of:
   forming a base plate from a material that is thermally and electrically conductive and has a first coefficient of thermal expansion and a thermal conductivity that is greater than about 100 W/m·K;
   forming a side wall band from a material that is electrically conductive and has a thermal conductivity of less than about 100 W/m·K and has a second coefficient of thermal expansion that is within ±30% of the first coefficient of thermal expansion;
   forming a metallurgical bond between a top surface of the base plate and a bottom edge of the side wall band;
   placing a lid on a top edge of the side wall band to form a sealed volume between the base plate, the sidewall band, and the lid.

23. The method of claim 22, wherein the step of forming a metallurgical bond includes at least one of brazing, soldering, and welding the base plate to the side wall band.

* * * * *